United States Patent [19]

Sollner

[11] Patent Number: 4,831,340
[45] Date of Patent: May 16, 1989

[54] HARMONIC MULTIPLIER USING RESONANT TUNNELING DEVICE

[75] Inventors: T. C. L. Gerhard Sollner, Winchester, Mass.

[73] Assignee: Massachusetts Institute of Technology, Cambridge, Mass.

[21] Appl. No.: 142,741

[22] Filed: Jan. 11, 1988

[51] Int. Cl.[4] .............................................. H03B 19/16
[52] U.S. Cl. .................................. 331/76; 307/219.1; 307/322; 357/4; 357/16
[58] Field of Search ....................... 331/76, 53, 107 T; 307/219.1, 322, 323; 328/16–20; 357/4, 16

[56] References Cited

U.S. PATENT DOCUMENTS

| | | | |
|---|---|---|---|
| 3,311,812 | 3/1967 | Geiszler et al. | 331/76 X |
| 4,475,452 | 5/1988 | Sollner | 357/16 X |
| 4,712,121 | 12/1987 | Yokoyama | 357/4 |
| 4,780,749 | 10/1988 | Schulman | 357/16 X |

OTHER PUBLICATIONS

"Three-dimensional Integration of Resonant Tunneling Structures for Signal Processing and Three-state Logic", *Appl. Phys. Lett.* 52(25), Jun. 20, 1988, Potter et al., pp. 2163–2164.

"Resonant Tunneling Device with Multiple Negative Differential Resistance: Digital and Signal Processing Applications with Reduced Circuit Complexity", *IEEE Transactions on Electron Devices*, vol. ED-34, No. 10, Oct. 1987, pp. 2185–2191.

Page, *Proc. IRE*, 46: Oct. 1958, "Harmonic Generation with Ideal Rectifiers", pp. 1738–1740.

J. M. Manley and H. E. Rowe, *Proc. IRE*, 44: "Some General Properties of Nonlinear Elements –Part I. General Energy Relations", Jul. 1956, pp. 904–913.

Chang et al., *Appl. Phys. Lett.* 24: "Resonant Tunneling in Semiconductor Double Barriers", Jun. 15, 1974, pp. 593–595.

Sollner et al., *Appl. Phys. Lett.* 43: "Resonant Tunneling Through Quantum Wells at Frequencies Up to 2.5 THz", Sep. 15, 1983, pp. 588–590.

Sollner et al., *Appl. Phys. Lett.* 45, "Quantum Well Oscillators", Dec. 15, 1984, pp. 1319–1321.

Goodhue et al., *Appl. Phys. Lett. 49*, "Large Room-Temperature Effects from Resonant Tunneling Through AlAs Barriers", Oct. 27, 1986, pp. 1086–1088.

Andreyev, *Radio Eng. and Electron Phys.*, 20:136 (1975), "Frequency Multiplication in Devices with Negative Resistance".

Brown and Tannenwald, *SPIE*, 666 (1986), "Advances in Far-Infrared Heterodyne Detectors", pp. 38–50.

Brown et al., *Appl. Phys. Lett.* 50, "Millimeter-Band Oscillations Based on Resonant Tunneling in a Double-Barrier Diode at Room Temperature", Jan. 12, 1987, pp. 83–85.

Sollner et al., *Appl. Phys. Lett.* 50, "Observation of Millimeter-Wave Oscillations from Resonant Tunneling Diodes and Some Theoretical Considerations of Ultimate Frequency Limits", Feb. 9, 1987, pp. 332–334.

Brody, *High Tech Business*, Nov. 1987, "Big Hopes for Small Dishes", pp. 41–45.

Sollner et al., in *Picosecond Electronics and Optoelectronics II*, F. J. Leonberger et al., (eds.), Springer-Verlag, Berlin, p. 102 (1987), "Microwave and Millimeter-Wave Resonant Tunneling Diodes".

*Primary Examiner*—Siegfried H. Grimm
*Attorney, Agent, or Firm*—Hamilton, Brook, Smith & Reynolds

[57] ABSTRACT

An harmonic multiplier comprising a resonant-tunneling diode responsive to a fundamental frequency source oscillator for generating odd harmonics of said fundamental frequency. The resonant-tunneling diode has a current/voltage characteristics curve exhibiting antisymmetry about a zero-volt, zero-current origin and negative differential resistance with high current peaks and low current valleys.

12 Claims, 5 Drawing Sheets

HARMONIC MULTIPLIER USING RESONANT TUNNELING DEVICE

GOVERNMENT SUPPORT

The Government has supported the development of this invention under U.S. Air Force Contract No. F19628-85-C-0002 and Grant Number MIPR-AR0130-86 awarded by the Department of the Army.

BACKGROUND ART

This invention relates to resonant-tunneling diodes and to harmonic multipliers which generate harmonics of electromagnetic waves to produce output waves at frequencies above those conveniently available from fundamental oscillators.

Harmonic multipliers are often used, for example, in radio astronomy, where heterodyne receivers, at frequencies above 100 GHz, use power from a harmonic multiplier as the local oscillator source. Harmonic multipliers are also a primary source of power for laboratory molecular spectroscopy in the submillimeter wavelength spectrum.

Harmonic multipliers have traditionally used either the voltage-dependent resistance (a varistor) or capacitance (a varactor) associated with either metal-semiconductor (Schottky diodes) or p-n junctions to generate harmonics of fundamental input oscillators. Capacitive nonlinearities have been favored because of the higher available conversion efficiency between the power generated by the pump oscillator and that available at the desired harmonic. It is known [Page, Proc. IRE 46, 1738 (1958)] that a resistive nonlinearity containing no negative differential resistances can produce a conversion efficiency (ratio of power at the harmonic versus power at the fundamental) of at most $1/n^2$; where n is the harmonic number. On the other hand, varactors are limited by the Manley-Rowe relations [J. M. Manley and H. E. Rowe, Proc. IRE 44, 404(1956)], which in this case allows a maximum conversion efficiency of unity. In practice many factors lower the efficiency, including the inability to properly terminate all harmonics below the desired output frequency, so as to prevent the bulk of the power being delivered at unwanted frequencies. This last fact greatly increases the circuit complexity of high-harmonic multipliers.

Resonant tunneling structures or quantum well resonators have been described in Chang et al. Appl. Phys. Lett. 24, 593 (1974) and Sollner et al. Appl. Phys. Lett. 43, 588 (1983) and Appl. Phys. Lett. 45, 1319 (1984) and more recently in Goodhue et al. Appl. Phys. Lett. 49, 1086 (1986) incorporated herein by reference. Resonant tunneling occurs when two or more semitransparent barriers are placed closely enough together that charge carriers interact coherently with them. For example, in a mesa-isolated quantum well resonator; a thin (5 nm) layer of material such as GaAs is sandwiched between two thin (5 nm) layers of GaAlAs. The GaAlAs layers form the transparent barriers and the GaAs layer constitutes the quantum well. The addition of the aluminum raises the band gap and the conduction band energy of the barriers above that of the GaAs. These barriers therefore act as partially transparent mirrors to electrons. Charge transport occurs primarily by tunneling through the barriers. The two mirrors from the electronic analog of a Fabry-Perot resonator with peaks in the electron transmission (current) occurring as function of the incident electron energy (voltage). The resonant states formed between the barriers greatly increase the tunneling probability of carriers with energy equal to that of the states, resulting in peaks and valleys in the current as the voltage across the structure is increased. Typically the barriers are made from an epitaxially lattice matched material of larger bandgap than the material sandwiched between. Usually the barriers are formed by replacing Ga with Al atoms when the contacts and the well are made of GaAs.

DISCLOSURE OF THE INVENTION

The invention comprises a method and apparatus for harmonic generation using the voltage-dependent resistance of resonant-tunneling diodes. Resonant tunneling diodes, unlike conventional Schottky diodes, possess negative differential resistance regions in the current-voltage characteristic (I-V) curve. It is therefore possible, as discussed by Andreyev [Radio Eng. and Electron. Phys. 20, 136 (1975)], to surpass the limits found by Page [Proc. IRE 46 1738 (1958)] for resistive mixers. Another advantage of resonant-tunneling diodes as harmonic generators is that, under certain conditions, it is possible to confine most of the harmonic output power to a single harmonic frequency. These conditions include, among other things, (1) providing a tunnelling diode with large peak to valley ratios in its IV characteristics, (2) with the shape of the IV characteristic, such that, when driven by the fundamental oscillator, the peaks and valleys in the current waveform are equally spaced in time, and (3) with the voltage amplitude at the fundamental adjusted to yield the proper number and spacing of peaks and valleys in the current waveform. For Schottky-diode multipliers, the lower harmonics always contain higher potential output power, and so must be properly reactively terminated at these frequencies. Avoiding these additional "idler" circuits, by confining harmonic output to a single frequency, greatly simplifies circuit design and will therefore enhance efficiency, especially in the millimeter and submillimeter wavelength range where it is difficult to avoid significant resistive loss. Also, no DC bias is required for resonant-tunneling diodes, further simplifying the multiplier circuit.

For resonant-tunneling diodes available today, output frequencies of several hundred gigahertz are feasible. Even higher frequencies may be available with optimized diodes. This part of the frequency spectrum now suffers from a lack of available solid-state sources, so resonant-tunneling multipliers should fill this need, at least for low-power requirements.

BEST MODE OF CARRYING OF THE INVENTION

Figure 1:
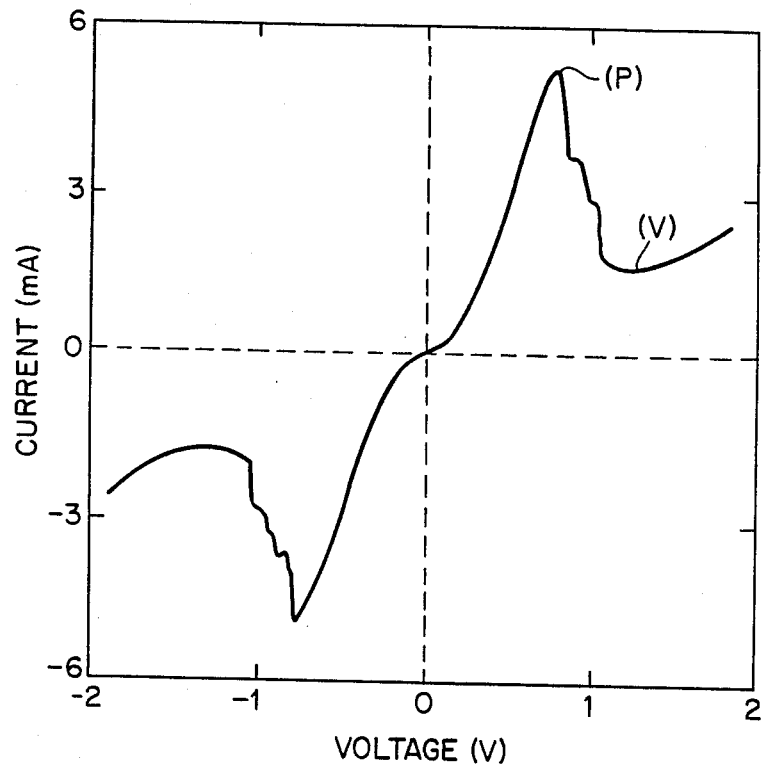
FIG. 1 is an experimental curve of current (I) in milliamps versus voltage (V) in volts for a double barrier resonant-tunneling diode.

A typical I-V curve for a double-barrier resonant-tunneling diode is shown in FIG. 1. The presence of a peak (P) and valley (V) in the I-V curve, combined with the overall antisymmetry of the I-V curve about the (zero voltage, zero current) origin, [i.e., $I(V) = -I(-V)$], offer the potential for efficient odd-harmonic generation with an unbiased resonant-tunneling diode. Note the curve between the peak (P) and the valley (V) illustrates the negative resistance characteristic of the device. As voltage V increases, the current I decreases between these points on the curve. When the diode is pumped with an AC signal, such that the peak amplitude of the voltage across the diode occurs above the resonant current peak, at least three local maxima occur in the diode current waveform over one cycle, corresponding to third or higher odd-harmonic generation.

Figure 2:
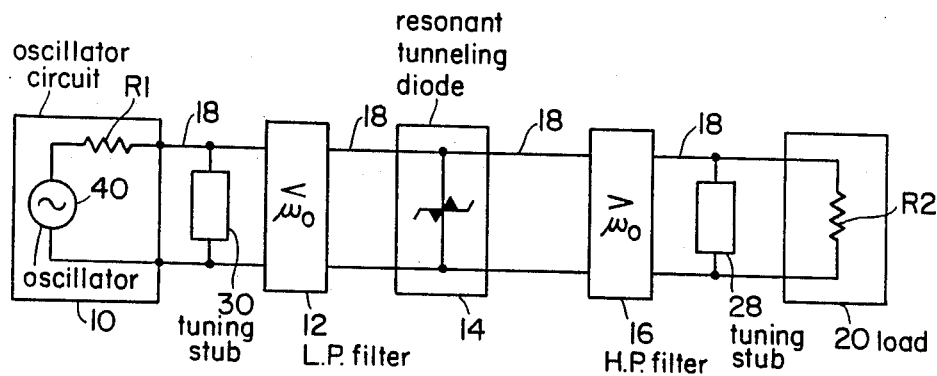
FIG. 2 is a schematic diagram of a harmonic multiplier circuit of the invention.

FIG. 2 is a schematic illustration of a typical harmonic multiplier circuit of the invention. An oscillator circuit 10, comprising an oscillator 40 and source resistor R1 in series is coupled across transmission line 18. Oscillator 40 is capable of generating electromagnetic wave signals within a range of fundamental frequencies below a predetermined frequency $\omega_o$. Transmission line 18 may comprise waveguide line, coaxial line, or other transmission lines, depending upon $\omega_o$. Tuning stub 30 is coupled across line 18 to provide optimum impedance matching between the oscillator circuit 10 and the diode 14. A low pass filter 12 with a cutoff frequency of $\omega_o$ is provided across line 18 between the oscillator circuit 10 and the resonant-tunneling diode 14. Power, only in frequencies below $\omega_o$, passes in either direction through filter 12.

The power from oscillator circuit 10, which passes through filter 12, is coupled across resonant-tunneling diode 14, wherein harmonics of the fundamental oscillator frequency are generated. The generated harmonics are coupled by line 18 to high pass filter 16, having a cutoff frequency $\omega_o$. Filter 16 passes only frequencies above $\omega_o$ to load 20 represented by load resistor R2. Tuning stub 28 across line 18 enables optimum impedance matching between the diode 14 and the load resistor R2 at the desired harmonic frequency.

Source resistor R1 is chosen to best match the fundamental power from the oscillator to the resonant-tunneling diode, while load resistor R2 is chosen to optimize harmonic power transfer from the diode to the load 20.

Figure 9:
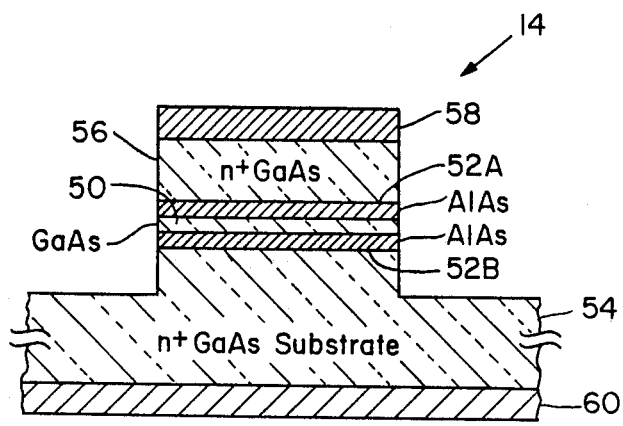
FIG. 9 is a cross-sectional view of a resonant tunneling diode device.

Preferably, the resonant-tunneling diode 14 should comprise a thin conducting layer 50 sandwiched between two barrier layers 52A and 52B (See FIG. 9). The diode 14 of FIG. 9 is a mesa isolated quantum well resonant-tunneling diode in which the diode layers are formed on an n+ GaAs substrate 54 by molecular beam epitaxy. A contact layer 56 of n+ GaAs is formed over the upper barrier layer 52A. Finally, ohmic contacts 60 and 58 are applied to the substrate 54 and layer 56, respectively. We have found that an undoped GaAs well layer of about 2 to 10 nm in thickness, with 5 nm preferable, sandwiched between barrier layers of AlAs in a range of about 1 to 3 nm in thickness with 1.7 nm preferable provide good peak to valley ratio and high current density at room temperature.

Figure 3:
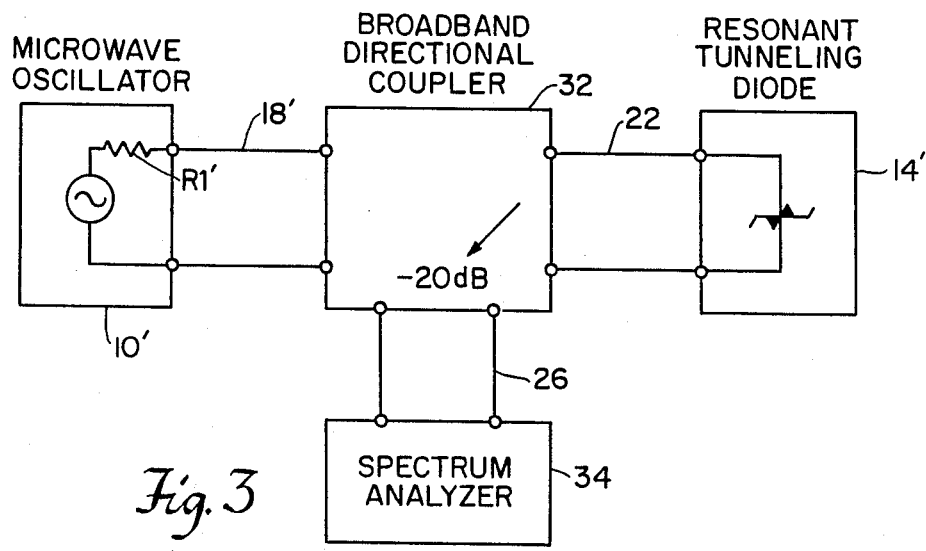
FIG. 3 is a schematic showing the experimental circuit used to obtain the frequency data of FIG. 4.

A resonant-tunneling diode with the I-V curve shown in FIG. 1 was mounted in a coaxial, whisker-contacted package and placed in the test circuit shown in FIG. 3. Like items in FIG. 3 carry the same numeral reference as in FIG. 2 with a prime suffix. In FIG. 3, the load is comprised of a spectrum analyzer 34.

An oscillator 10' is coupled by coaxial cable 18' to a wide band directional coupler 32. Energy from oscillator 10' is coupled over coaxial line 22 to the resonant-tunneling diode 14' wherein harmonics of the fundamental oscillator frequency are generated and reflected back along the coaxial line 22 to coupler 12. Energy from diode 14' is coupled from coupler 12 across coaxial line 26 to analyzer 34.

Figure 4:
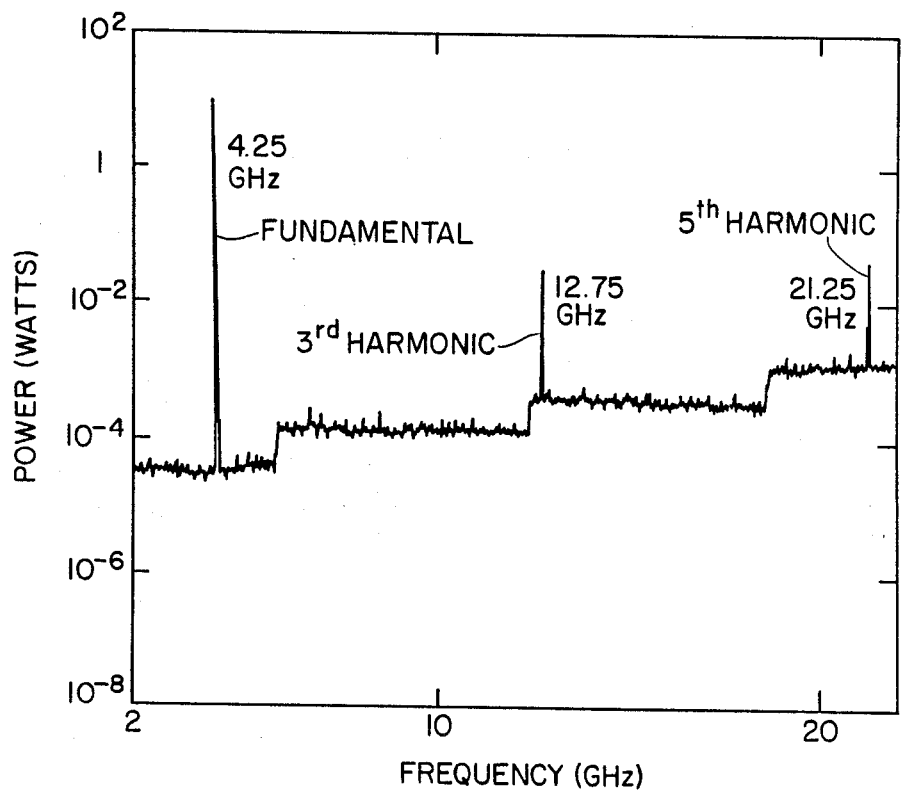
FIG. 4 is an experimental plot of power in watts versus frequency in gigahertz into the load 20 of FIG. 2.

All components were connected together with 50-ohm coaxial lines. The circuit was relatively free of resonances to 22 GHz. A microwave oscillator 10 at a fundamental frequency of 4.25 GHz was adjusted to give optimum conversion efficiency to the fifth harmonic of the diode 14 resulting in the spectrum shown in FIG. 4. The power available at the fundamental (4.25 GHz) was obtained by replacing the resonant-tunneling diode 14 with a short. The best fifth-harmonic conversion efficiency obtained was 0.5%. As expected, the power converted to even harmonics was more than 20 dB below the odd-harmonic output.

Figure 5:
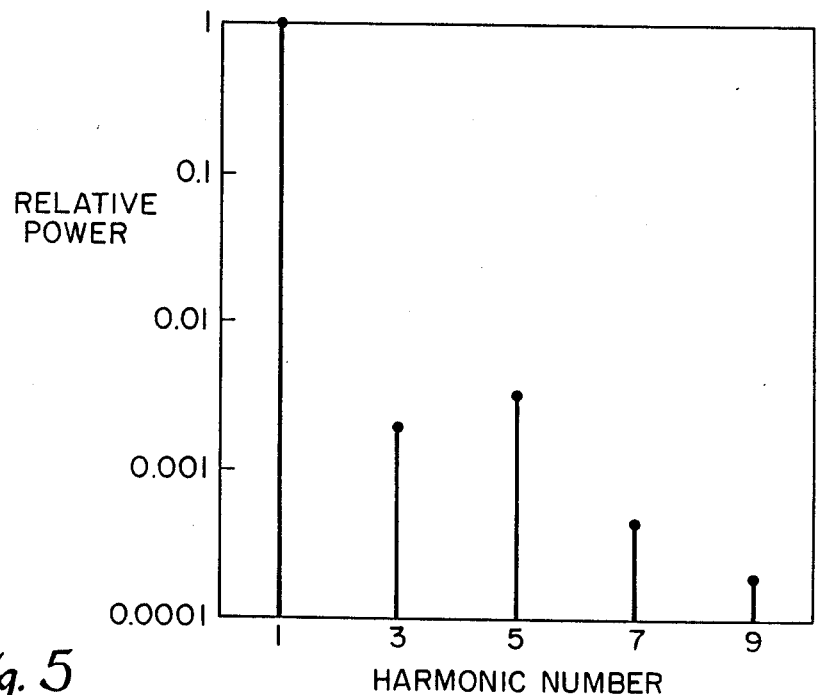
FIG. 5 is a theoretical plot of power relative to the fundamental power versus harmonic number for the resonant-tunneling diode characterized by the I-V curve shown in FIG. 1.

To estimate the conversion efficiency expected from a resonant-tunneling diode, the I-V curve of FIG. 1 was fitted to a piece-wise continuous curve, and a tunneling diode circuit having the response characteristics of FIG. 3 was simulated using lumped circuit elements. The spectrum resulting from this calculation is shown in FIG. 5. The calculated fifth-harmonic conversion efficiency is 0.3% rather than the observed value of 0.5%, and the calculated third-harmonic ouput is also somewhat below that observed. It is possible that the differences may arise from neglect in the lumped-element circuit numerical model of the voltage-dependent capacitance that occurs in the resonant-tunneling diode. Still, the agreement with the measured spectrum of FIG. 4 indicates that the numerical model is a good approximation to the experimental measurement.

The lumped-element circuit model described above has been used to predict the performance of a resonant-tunneling diode multiplier when the I-V curve of the device is arranged to enhance harmonic generation. The characteristics that are desirable are a large peak to valley ratio and a shape that provides equal spacing in time between the maxima in the current waveform. For example, if the voltage waveform at the diode terminals were triangular (linear time variation) then the best I-V curve would have the current depend on the sine of the voltage. But, since the voltage changes more slowly at higher voltages, the I-V curve should be more compressed at higher voltages. The large peak to valley ratio of FIG. 6 results in large harmonic content in the current waveform, since the current peaks are large. The antisymmetry of the I-V curve is essential to achieve a current waveform that has peaks and valleys for both directions of the current and to produce a waveform with zero DC component, thereby avoiding the dissipation of power that would occur if it were non-zero. The simulated I-V curve shown in FIG. 6 has not been optimized for these characteristics, but it is a considerable improvement over the curve of FIG. 1.

Figure 6:
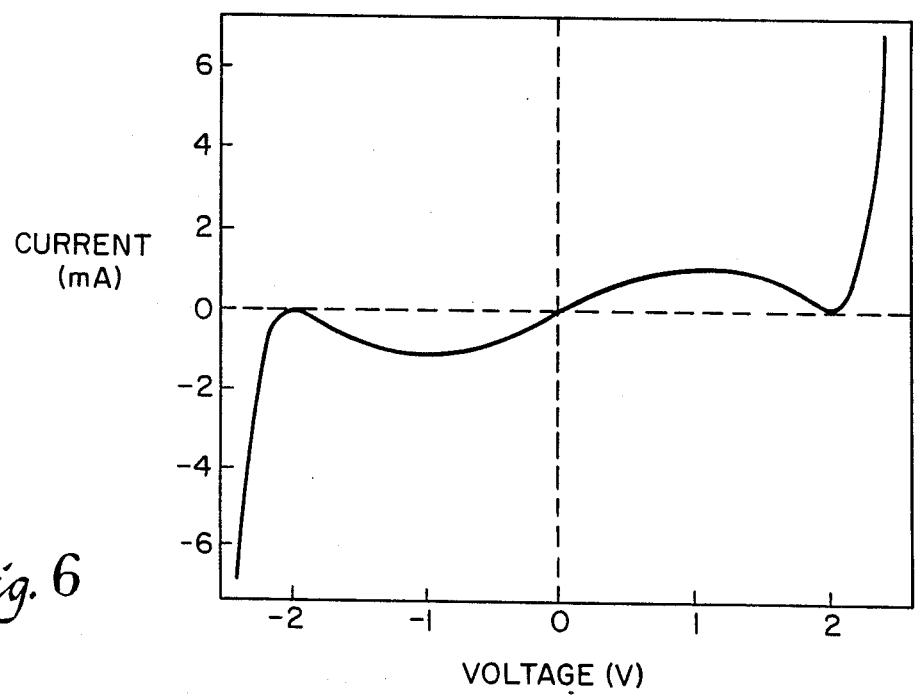
FIG. 6 is an I-V curve calculated to improve the harmonic-multiplier efficiency over that shown in FIG. 1.
Figure 7A:
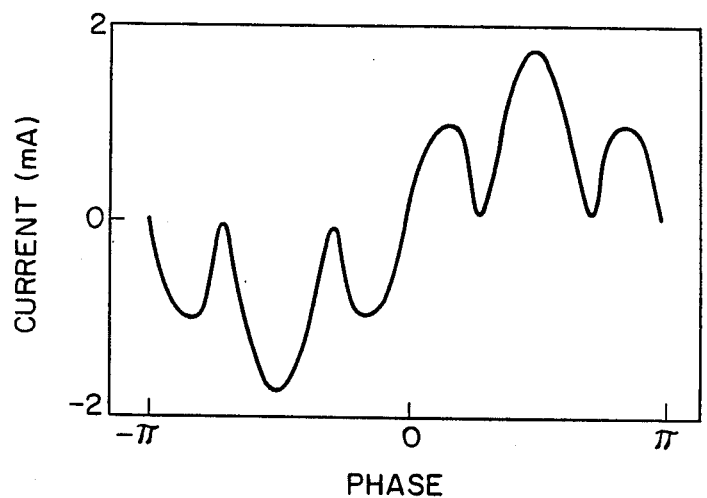
FIGS. 7a and 7b show the calculated current (a) and voltage (b) versus phase across the resonants-tunneling diode in the circuit of FIG. 3 when it is characterized by the I-V curve of FIG. 6.
Figure 7B:
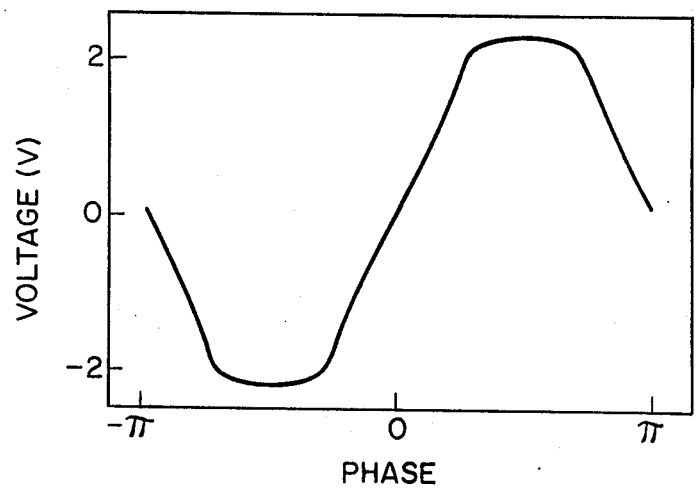

FIGS. 7a and 7b show the current (7a) and voltage (7b) waveforms that appear at the terminals of the diode whose I-V curve is shown in FIG. 6 when driven from a voltage source in series with a 500 ohm resistor. The voltage amplitude has been adjusted so that most of the available harmonic power appears at the fifth harmonic.

Figure 8:
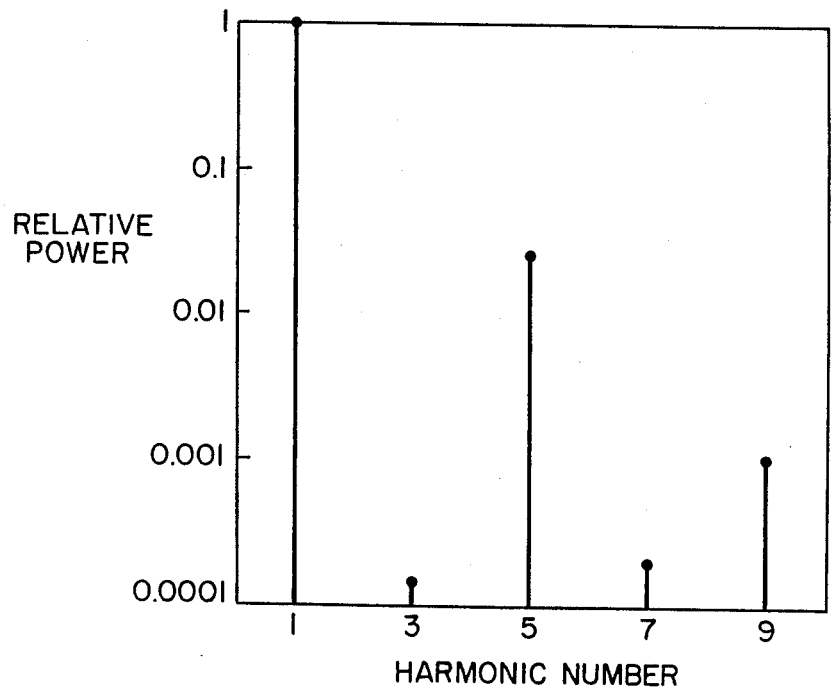
FIG. 8 is the power spectrum calculated from the waveforms of FIG. 7.

FIG. 8 shows the power spectrum at the terminals of the diode. This simulation yields a fifth-harmonic conversion efficiency of 2.7%. Additional optimization is still possible. The calculated efficiency is near the limit of $1/n^2$ derived by Page supra. Further improvements would surpass it.

The efficiency of multipliers using I-V curves similar to those of FIGS. 1 and 6 drops quickly for harmonics above the fifth because there is only one peak and valley in each quadrant of the curve. However, it is possible to have several peaks in a resonant-tunneling I-V curve. Two peaks would make possible the efficient generation of up to the ninth harmonic, three peaks allow the thirteenth harmonic, and so on. This could be achieved either by using higher energy levels in a single resonant-tunneling diode, or by putting two or more diodes in series. It is also possible to adjust the pump amplitude to produce most of the harmonic power in a single one of these high harmonics by keeping the current in the higher-voltage valleys sufficiently small. Thus, a single harmonic multiplier can convert power below 100 GHz to the terahertz range.

In order to realize the benefits of the zero bias features of the invention, it is important to construct the resonant-tunneling diode with symmetric features centered about the midpoint of the quantum well. Not only should the barrier thickness and well thickness be symmetrical, but the degree of doping should likewise retain the symmetry.

EQUIVALENTS

Those skilled in the art will recognize, or be able to ascertain, using no more than routine experimentation, other equivalents for the specific reactants, steps and techniques described herein. For example, and without limitation, such equivalents are intended to be included within the scope of the following claims.

The present invention relates, in general, to resonant-tunneling diodes made of compound semiconductor III-V or II-VI material. The III-V material is preferably gallium arsenide or alloys of gallium arsenides, such as the indium aluminum gallium arsenide system. The II-VI material may comprise mercury, cadmium telluride, or zinc selenide. For ease in description, the aluminum gallium arsenide system is used in the process description and it should be understood that references therein to this system are intended to also encompass other alloys.

What is claimed is:
1. A harmonic multiplier circuit comprising:
   (a) an oscillator for generating an electromagnetic wave at a fundamental frequency;
   (b) a resonant-tunneling device responsive to said wave and having a negative differential resistance and a current versus voltage characteristic curve with antisymmetry about an origin for generating only odd harmonics of said fundamental frequency; and
   (c) a load coupled to said device.
2. The circuit of claim 1 wherein the device is a resonant-tunneling diode with zero DC bias.
3. The multiplier of claim 2 wherein said wave produces a voltage across said diode having a peak amplitude which occurs above the peak current characteristic of said diode, such that at least three local maxima current peaks occur in the diode waveform over one cycle of the signal from the oscillator.
4. The multiplier of claim 2 wherein the tunneling diode comprises a thin quantum well layer between two barrier layers; said barrier layers comprising lattice matched material having a higher conduction-band energy than the quantum well.
5. The multiplier of claim 3 wherein the current versus voltage characteristic of said diode is comprised of peaks and valleys with overall antisymmetry about a zero current zero volts origin of the curve.
6. The multiplier of claim 4 wherein the material for the wall layer is undoped GaAs and the barrier layer material is AlAs.
7. The multiplier of claim 6 wherein the thickness of the well is in the range of 2 to 10 nanometers and the thickness of the barrier layer is in the range of 1 to 3 nanometers.
8. The multiplier of claim 6 wherein the well layer thickness is about 5 nanometers and the barrier layer thickness is about 1.7 nanometers.
9. In an harmonic multiplier circuit for generating harmonics of fundamental frequencies generated by a fundamental oscillator, the improvement comprising a resonant-tunneling diode responsive to said fundamental frequencies for generating odd harmonics thereof, said diode comprising a thin quantum well layer between two thin barriers layers of material with higher conduction-band energy than the quantum well layer; said diode having a current versus voltage characteristic that exhibits negative differential resistance and antisymmetry about an origin.
10. The multiplier of claim 9 in which the origin is zero volts.
11. The multiplier of claim 9 in which the well layer is formed of GaAs and the barrier layers of AlAs.
12. The circuit of claim 1 including:
   (a) a source resistor in series with said oscillator;
   (b) a tuning circuit coupled to said source resistor and oscillator for impedance matching the source resistor with said device;
   (c) a low-pass filter between said device and said oscillator which only allows power at and below the fundamental frequency to pass in either direction therethrough;
   (d) a high pass filter between said device and said load which only allows power above the fundamental frequency to pass in either direction therethrough;
   (e) a tuning circuit coupled to said load for impedance matching the load to said device.

* * * * *

UNITED STATES PATENT AND TRADEMARK OFFICE
CERTIFICATE OF CORRECTION

PATENT NO. : 4,831,340
DATED : May 16, 1989
INVENTOR(S) : T. C. L. Gerhard Sollner and Elliott R. Brown It is certified that error appears in the above—identified patent and that said Letters Patent is hereby corrected as shown below:

Title page:

Item 75:-- Add Elliott R. Brown, Billerica, MA.-- as second inventor.

Col. 6, line 29, after "well" insert ---layer---.

Col. 6, line 26, delete "wall" and insert ---well---.

Title page, Item [19] "Sollner" should read --Sollner et al--.

Signed and Sealed this

Ninth Day of January, 1990

Attest:

JEFFREY M. SAMUELS

Attesting Officer     Acting Commissioner of Patents and Trademarks